(12) United States Patent
Li et al.

(10) Patent No.: US 11,705,263 B2
(45) Date of Patent: Jul. 18, 2023

(54) CONTROLLABLE AND RECONFIGURABLE MAGNETIZATION SYSTEM AND METHOD FOR MAGNETIC SOFT-BODIED ROBOT

(71) Applicant: Huazhong University of Science and Technology, Hubei (CN)

(72) Inventors: Liang Li, Hubei (CN); Quanliang Cao, Hubei (CN); Xiaotao Han, Hubei (CN); Yuwei Ju, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 48 days.

(21) Appl. No.: 17/595,633

(22) PCT Filed: May 8, 2021

(86) PCT No.: PCT/CN2021/092317
§ 371 (c)(1),
(2) Date: Nov. 19, 2021

(87) PCT Pub. No.: WO2022/142050
PCT Pub. Date: Jul. 7, 2022

(65) Prior Publication Data
US 2022/0344088 A1    Oct. 27, 2022

(30) Foreign Application Priority Data
Dec. 31, 2020   (CN) .......................... 202011638321.6

(51) Int. Cl.
*H01F 13/00*      (2006.01)
(52) U.S. Cl.
CPC ................... *H01F 13/00* (2013.01)
(58) Field of Classification Search
CPC ....... H01F 13/00; H10N 30/802; H10N 35/00
(Continued)

(56) References Cited

U.S. PATENT DOCUMENTS

2020/0027653 A1    1/2020   Terauchi et al.

FOREIGN PATENT DOCUMENTS

CN    110216667 A   *  9/2019    ............... B25J 9/10
CN    110216667 A      9/2019
(Continued)

OTHER PUBLICATIONS

Machine translation of Cao et al. Chinese Patent Document CN 110216667 A Sep. 10, 2019 (Year: 2019).*
(Continued)

*Primary Examiner* — Kevin J Comber
(74) *Attorney, Agent, or Firm* — Hamre, Schumann, Mueller & Larson, P.C.

(57) ABSTRACT

The present invention belongs to the technical field of magnetically controlled soft-bodied robots, and more specifically, relates to a controllable and reconfigurable magnetization system and method for a magnetic soft-bodied robot. The system comprises a pulse power supply module, magnetizing coil units axisymmetrically arranged up and down, and a magnetic soft-bodied robot placed between the upper and lower magnetizing units. By means of changing the relative current flow direction of the upper and lower magnetizing coil modules, radial and vertical magnetic fields can be generated between the magnetizing coils arranged oppositely without any mechanical movement, so that the internal magnetization direction of the magnetic soft-bodied robot can be configured simply and flexibly. The present invention realizes for the first time the particle magnetization and synchronization of bidirectional orientations, and decouples the material preparation process of the magnetic soft-bodied robot from the magnetization process, so that the entire manufacturing process is very simple. Moreover, the internal magnetization distribution is reconfigurable, which provides a completely new technical
(Continued)

approach for realizing multifunctional magnetic soft-bodied robots.

16 Claims, 5 Drawing Sheets

(58) Field of Classification Search
USPC .......................................................... 361/143
See application file for complete search history.

(56) References Cited

FOREIGN PATENT DOCUMENTS

| | | | |
|---|---|---|---|
| CN | 110783055 A | * | 2/2020 |
| CN | 110783055 A | | 2/2020 |

OTHER PUBLICATIONS

Machine translation of Cao et al. Chinese Patent Document CN 110783055 A Feb. 11, 2020 (Year: 2020).*
Xiang et al., Did you mean: Motion Characteristics of magnetic control micro-soft crawling robot, Journal of Mechanical Engineering, vol. 56 No. 17, Sep. 2020, with English Abstract, 9 pages provided.
Ju et al., "Reconfigurable magnetic soft robots with multimodal locomotion", Nano Energy, vol. 87, Sep. 2021, 9 pages provided.

* cited by examiner

CONTROLLABLE AND RECONFIGURABLE MAGNETIZATION SYSTEM AND METHOD FOR MAGNETIC SOFT-BODIED ROBOT

TECHNICAL FIELD

The present invention belongs to the technical field of magnetically controlled soft-bodied robots, and more specifically, relates to a controllable and reconfigurable magnetization system and method for a magnetic soft-bodied robot.

BACKGROUND ART

Magnetic soft-bodied robotics technology driven by an external magnetic field has received extensive attention due to its significant advantages such as non-contact and strong controllability, and its potential applications in many fields such as biomedicine and bionics.

The main material of the magnetic soft-bodied robot is a magnetic composite material composed of magnetic particles and soft materials, wherein in order to make the magnetic soft-bodied robot produce significant magnetic response effects under a lower external magnetic field, permanent magnetic materials such as neodymium, iron and boron are generally used as magnetic particles, and the magnetic materials can have strong residual magnetization after high-field magnetization.

In the field of magnetic soft-bodied robots, an interesting and challenging problem is how to realize a controllable magnetization distribution inside the material so that it can interact with the external magnetic field to generate abundant deformation characteristics and motion patterns. So far, there are mainly three mainstream magnetization adjustment and control methods: (1) micro-assembly after magnetization; (2) template-assisted magnetization; and (3) magnetic field-assisted reorientation of magnetized particles. Compared with the latter two methods, the shortcomings of the first method are the problems that its assembly is time-consuming and that it is difficult to use for small-scale complex magnetization adjustment and control. The second method is the simplest in operation, but the configuration of the magnetization direction is limited and it requires the template to change with the magnetization characteristics. The third method can be further divided into a 3D printing mode and an ultraviolet (UV)-based mode, which were developed by the research group of Professor Zhao Xuanhe of the Massachusetts Institute of Technology and the research group of Professor Eric Diller of the University of Toronto in Canada, respectively. Their work has all shown that the local magnetization direction of magnetized particles can be effectively adjusted by means of the external magnetic field, thereby realizing programmable magnetization with multiple distribution patterns. However, the third method also has some shortcomings. For example, due to the limitation of the orientation magnetic field equipment, the applied external magnetic field usually does not exceed 1 T, and it is impossible to ensure that the magnetized particles can be completely reoriented along the direction of the magnetic field, so that the magnetization intensity of the magnetic robot is weakened to a certain extent. In addition, since the magnetization adjustment and control process and the hardening preparation process of the soft material are carried out synchronously in the third method, the magnetization characteristics of the material cannot be changed after its preparation is completed, that is, it is difficult to reconfigure.

Recently, the applicant's research group has also proposed a magnetization system for a magnetically controlled soft-bodied robot based on a controllable micro-coil array (Application No.: 201910557705.6) and a device and method for adjusting and controlling internal magnetization characteristics of a magnetic soft-bodied robot on the basis of a long wire or a solenoid coil (Application No.: 201911010537.5). However, the former introduces high-strength micro-coils into the magnetic soft material. On the one hand, it requires high coil preparation technology. On the other hand, how to ensure that the embedded coil does not affect the deformation characteristic of the soft material remains to be solved. The main problem of the latter is that it is difficult to realize controllable magnetization under small-scale magnetic soft-bodied robots.

SUMMARY OF THE INVENTION

In view of the defects of the prior art, the present invention provides a system and method for adjusting and controlling internal magnetization characteristics of a magnetic soft-bodied robot, which use magnetizing coil units axisymmetrically arranged up and down to perform focusing of magnetic fields, and realize the generation, adjustment and control of magnetization magnetic field directions of small-scale regions in cooperation with pulse current control. It is intended to solve the problems in the prior art of complicated magnetization process, difficult reconfiguration of internal magnetization characteristics, and poor implementation of magnetically controlled soft-bodied robots.

In order to achieve the above objective, the present invention provides a system for adjusting and controlling internal magnetization characteristics of a magnetic soft-bodied robot, comprising a pulse power supply module, a magnetizing coil module, and a magnetic soft-bodied robot;

wherein the pulse power supply module is used to provide a pulse current for the magnetizing coil module;

the magnetizing coil module is used to generate an oscillating or non-oscillating magnetic field under the pulse current provided by the pulse power supply module, and to perform non-oscillating magnetization or oscillating demagnetization of the magnetic soft-bodied robot;

the magnetizing coil module comprises an upper magnetizing coil unit and a lower magnetizing coil unit, the upper magnetizing coil unit and the lower magnetizing coil unit are axisymmetrically arranged up and down, the upper magnetizing coil unit and the lower magnetizing coil unit each comprise a coil, the magnetic soft-bodied robot is located between the upper magnetizing coil unit and the lower magnetizing coil unit, a target magnetization region of the magnetic soft-bodied robot is located in a magnetic field action region of the upper magnetizing coil unit and the lower magnetizing coil unit, and the upper magnetizing coil unit and the lower magnetizing coil unit axisymmetrically arranged up and down are used to focus magnetic fields generated by their coils to the target magnetization region of the magnetic soft-bodied robot; and when in use, wiring modes of the coils in the upper magnetizing coil unit and the lower magnetizing coil unit are set according to magnetization requirements of the target magnetization region of the magnetic soft-bodied robot to control current directions in the coils in the upper magnetizing coil unit and the lower magnetizing coil unit, and then perform magnetization adjustment and control on the target magnetization region of the magnetic soft-bodied robot.

Preferably, the wiring modes of the coils in the upper magnetizing coil unit and the lower magnetizing coil unit are set according to the magnetization requirements of the target magnetization region of the magnetic soft-bodied robot to control the current directions in the coils in the upper magnetizing coil unit and the lower magnetizing coil unit, and then to control a radial or axial magnetic field to be generated in the target magnetization region of the magnetic soft-bodied robot, which is specifically as follows:

when the current direction of the coil in the upper magnetizing coil unit is controlled to be the same as the current direction of the coil in the lower magnetizing coil unit, the axial magnetic field is generated in the target magnetization region of the magnetic soft-bodied robot, and magnetic particles in the target magnetization region form an axial magnetization distribution characteristic; and when the current direction of the coil in the upper magnetizing coil unit is controlled to be opposite to the current direction of the coil in the lower magnetizing coil unit, the radial magnetic field is generated in the target magnetization region of the magnetic soft-bodied robot, and the magnetic particles in the target magnetization region form a radial magnetization distribution characteristic.

Preferably, the pulse power supply module comprises a discharge capacitor, a discharge switch and a freewheeling circuit;

the discharge capacitor is used to store electric energy;

the discharge switch is used to trigger conduction of the discharge circuit, so that a pulse current provided by the discharge capacitor can flow into the magnetizing coil module; and the freewheeling circuit comprises a freewheeling diode and a freewheeling resistor, and is used to adjust a current waveform.

Preferably, the coil is formed by wire winding or conductor cutting, a reinforcing material is arranged on the periphery of the coil, and the coil is used as a discharge circuit load to generate a magnetic field.

Preferably, the upper magnetizing coil unit and the lower magnetizing coil unit each further comprise a magnetic concentrator, the magnetic concentrator is made of a good conductor material, the magnetic concentrator comprises two hollow cylinder structures coaxially arranged up and down with different end surface areas, wherein the end surface area of a first cylinder structure is smaller than the end surface area of a second cylinder structure; and the magnetic concentrator further comprises a magnetic concentrator gap arranged along a radial direction.

Preferably, one end of the magnetic concentrator gap arranged along the radial direction is located at an inner wall of the first cylinder structure and the second cylinder structure, and the other end is located at an outer side edge of the second cylinder structure.

Preferably, the lower magnetizing coil unit is coaxially arranged with a first supporting plate, a lower coil arranged with a reinforcement layer on the periphery, an insulating plate, a lower magnetic concentrator and a second supporting plate, in order from bottom to top;

the upper magnetizing coil unit is coaxially arranged with a first supporting plate, an upper coil arranged with a reinforcement layer on the periphery, an insulating plate, an upper magnetic concentrator, and a second supporting plate, in order from top to bottom;

a positioning plate for positioning the magnetic soft-bodied robot is arranged between the upper magnetizing coil unit and the lower magnetizing coil unit;

the upper magnetic concentrator and the lower magnetic concentrator have the same structure, and are axisymmetrically arranged up and down; the magnetic soft-bodied robot is arranged between an end surface of the first cylinder structure of the upper magnetic concentrator and an end surface of the first cylinder structure of the lower magnetic concentrator, and the upper magnetic concentrator and the lower magnetic concentrator axisymmetrically arranged up and down are used to further focus magnetic fields generated by an upper coil and a lower coil to the target magnetization region of the magnetic soft-bodied robot; and the upper coil and the lower coil are arranged in series to ensure consistency of a time sequence.

When in use, wiring modes of the upper coil and the lower coil are set according to the magnetization requirements of the target magnetization region of the magnetic soft-bodied robot to control current directions in the upper coil and the lower coil and eddy current directions induced in the upper magnetic concentrator and the lower magnetic concentrator, and then to control a radial or axial magnetic field to be generated in the target magnetization region of the magnetic soft-bodied robot.

Preferably, the wiring modes of the coils in the upper magnetizing coil unit and the lower magnetizing coil unit are set according to the magnetization requirements of the target magnetization region of the magnetic soft-bodied robot to control the current directions in the coils in the upper magnetizing coil unit and the lower magnetizing coil unit, and then to control the radial or axial magnetic field to be generated in the target magnetization region of the magnetic soft-bodied robot, which is specifically as follows:

when the current direction of the coil in the upper magnetizing coil unit is controlled to be the same as the current direction of the coil in the lower magnetizing coil unit, the eddy current direction induced in the upper magnetic concentrator is the same as the eddy current direction induced in the lower magnetic concentrator, and then the axial magnetic field is generated in the target magnetization region of the magnetic soft-bodied robot, and magnetic particles in the target magnetization region form an axial magnetization distribution characteristic; and when the current direction of the coil in the upper magnetizing coil unit is controlled to be opposite to the current direction of the coil in the lower magnetizing coil unit, the eddy current direction induced in the upper magnetic concentrator is opposite to the eddy current direction induced in the lower magnetic concentrator, and then the radial magnetic field is generated in the target magnetization region of the magnetic soft-bodied robot, and the magnetic particles in the target magnetization region form a radial magnetization distribution characteristic.

According to another aspect of the present invention, there is provided a method for adjusting and controlling internal magnetization characteristics of a magnetic soft-bodied robot on the basis of the system described above, comprising the following steps:

(1) placing the magnetic soft-bodied robot between the upper magnetizing coil unit and the lower magnetizing coil unit, and moving the target magnetization region of the magnetic soft-bodied robot to the magnetic field action region;

(2) determining a magnitude of resistance of the freewheeling circuit in the pulse power supply module according to the magnetization requirements of the target magnetization region of the magnetic soft-bodied robot;

(3) selecting connection modes of the coils in the upper magnetizing coil unit and the lower magnetizing coil unit according to magnetization direction requirements of the target magnetization region of the magnetic soft-bodied robot; and (4) charging the discharge capacitor in the pulse power supply module, and then triggering the discharge switch to discharge the upper magnetizing coil unit and the lower magnetizing coil unit, and to generate a magnetic field in the target magnetization region of the magnetic soft-bodied robot so as to produce a magnetization effect.

Preferably, the method further comprises step (5): repeating steps (1) to (4) to complete the magnetization adjustment and control of other target magnetization regions of the magnetic soft-bodied robot.

Preferably, the magnetization requirements in step (2) include magnetization or demagnetization; and the magnitude of resistance of the freewheeling circuit in the pulse power supply module is 0 or infinity.

Preferably, the connection modes in step (3) include a forward connection or a reverse connection.

Generally speaking, compared with the prior art, the above technical solutions conceived by the present invention have the following beneficial effects:

(1) The system for adjusting and controlling the internal magnetization characteristics of the magnetic soft-bodied robot provided by the present invention has a relatively simple system structure and adjustment and control method. The system comprises magnetizing coil units axisymmetrically arranged up and down, and a magnetic soft-bodied robot placed between the upper and lower magnetizing units. By means of changing the relative current flow direction of the upper and lower magnetizing coil modules, local radial and vertical magnetic fields can be generated in the region below the magnetic concentrator between the magnetizing coils arranged oppositely without any mechanical movement, so that the internal magnetization direction of the magnetic soft-bodied robot can be configured simply and flexibly, realizing the controllable internal magnetization characteristics of the robot.

(2) In the preferred technical solution of the present invention, a magnetic concentrator is also integrated in the upper and lower magnetizing units, so that the magnetization system of the present invention has high magnetic field generation efficiency and strong magnetization ability. The magnetization system in the present invention includes two levels of magnetization effects. The first level is that the magnetic field can be concentrated in the central region where the magnetic soft-bodied robot is located by using a magnetization driving coil system axisymmetrically arranged up and down. The second level is that the magnetic concentrator can further concentrate the magnetic field on its small end face region, which is the target magnetization region of the magnetic soft-bodied robot. Therefore, based on the magnetization system, it is easy to generate pulsed strong magnetic field conditions of 2 T or more, realizing saturation magnetization of particles.

(3) The system for adjusting and controlling the internal magnetization characteristics of the magnetic soft-bodied robot with the magnetic concentrator of the present invention can realize the axial and radial magnetization patterns by means of adjusting the current flow directions of the double coils, and at the same time, can realize focusing of the magnetic field by means of the magnetic concentrator. On the one hand, it improves the utilization rate of the magnetic field, and on the other hand, it provides an effective way to realize the precise adjustment and control of the magnetic field in local small-scale regions. The present invention realizes the particle magnetization and synchronization of bidirectional orientations for the first time, and decouples the material preparation process of the magnetic soft-bodied robot from the magnetization process, so that the entire manufacturing process is very simple. Moreover, the internal magnetization distribution is reconfigurable, which provides a completely new technical approach for realizing multifunctional magnetic soft-bodied robots.

(4) It can realize multiple functions and is reusable. In the present invention, the magnetization adjustment and control process is after the hardening preparation process of the soft material, that is, the two are independent of each other. Therefore, the previously magnetized magnetic soft-bodied robot can be adjusted again for reconfigurable magnetization of the magnetic soft-bodied robot according to the magnetization requirements, such as changing the magnetization direction distribution, performing demagnetization or the like.

(5) It is easy to realize the adjustment and control of magnetization characteristics of cross-scale magnetic soft-bodied robots. In the present invention, the magnetic concentrator is used to generate a local magnetic field. The magnetic field action region has little correlation with the size of the coils, but mainly depends on the magnetic concentrator. Therefore, under the condition that the coils remain unchanged, the magnetization characteristics of soft-bodied robots of different scales can be adjusted and controlled by means of adjusting the size of the magnetic concentrator, which makes it possible to adjust and control the magnetization characteristics of the miniature soft-bodied robot.

BRIEF DESCRIPTION OF THE DRAWINGS

FIG. 3a is a schematic diagram of current distributions in double coils and a magnetic concentrator in the axial magnetization pattern; and FIG. 3b is a schematic diagram of magnetization directions of particles in a sample after axial magnetization;

FIG. 4a is a schematic diagram of current distributions in the double coils and the magnetic concentrator in the radial magnetization pattern; and FIG. 4b is a schematic diagram of magnetization directions of particles in a sample after radial magnetization;

DETAILED DESCRIPTION

Figure 1:
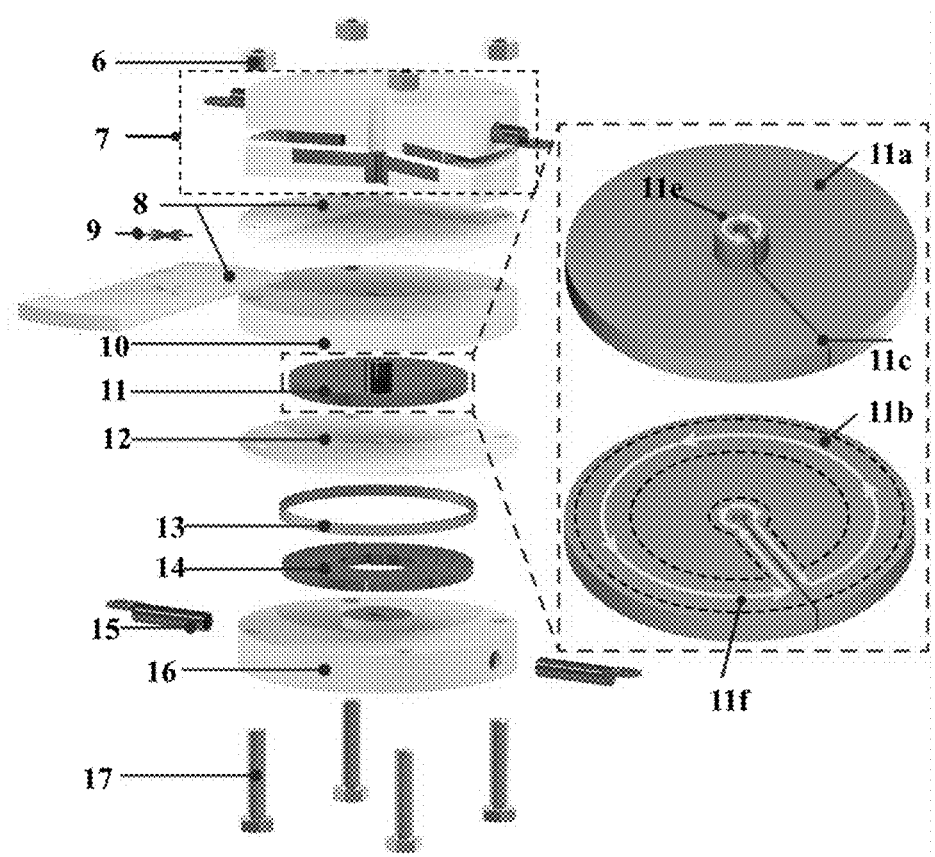
FIG. 1 is an exploded diagram of a three-dimensional structure of a magnetizing coil module provided by the present invention and a schematic diagram of a current flow direction in a magnetic concentrator.

In order to make the objectives, technical solutions and advantages of the present invention clearer, the present invention will be further described in detail below in conjunction with the drawings and embodiments. It should be understood that specific embodiments described herein are only used to explain the present invention and are not used to limit the present invention.

The present invention provides a system for adjusting and controlling internal magnetization characteristics of a magnetic soft-bodied robot, comprising a pulse power supply module, a magnetizing coil module, and a magnetic soft-bodied robot. The pulse power supply module is used to provide a pulse current for the magnetizing coil module. The magnetizing coil module is used to generate an oscillating or non-oscillating magnetic field under the pulse current provided by the pulse power supply module, and to perform non-oscillating magnetization or oscillating demagnetization of the magnetic soft-bodied robot. The magnetizing coil module comprises an upper magnetizing coil unit and a lower magnetizing coil unit. The upper magnetizing coil unit and the lower magnetizing coil unit are axisymmetrically arranged up and down. The upper magnetizing coil unit and the lower magnetizing coil unit each comprise a coil. The magnetic soft-bodied robot is located between the upper magnetizing coil unit and the lower magnetizing coil unit, and a target magnetization region of the magnetic soft-bodied robot is located in a magnetic field action region of the upper magnetizing coil unit and the lower magnetizing coil unit. The upper magnetizing coil unit and the lower magnetizing coil unit axisymmetrically arranged up and down are used to focus magnetic fields generated by their coils to the target magnetization region of the magnetic soft-bodied robot. When in use, wiring modes of the coils in the upper magnetizing coil unit and the lower magnetizing coil unit are set according to magnetization requirements of the target magnetization region of the magnetic soft-bodied robot to control current directions in the coils in the upper magnetizing coil unit and the lower magnetizing coil unit, and then perform magnetization adjustment and control on the target magnetization region of the magnetic soft-bodied robot.

The pulse power supply module is used to supply power to the magnetizing coil module including double coils. A magnetizing or demagnetizing function can be realized by means of turning on and off a freewheeling switch. In a preferred embodiment, magnetic concentrators are further integrated in the upper magnetizing coil unit and the lower magnetizing coil unit. The magnetizing coil module with the magnetic concentrators can realize axial and radial magnetization patterns by means of adjusting current flow directions of the double coils, and at the same time, can realize focusing of the magnetic field by means of the magnetic concentrator. On the one hand, it improves the utilization rate of the magnetic field, and on the other hand, it provides an effective approach for realizing precise adjustment and control of the magnetic field in local small-scale regions. The present invention realizes the particle magnetization and synchronization of bidirectional orientations for the first time, and decouples the material preparation process of the magnetic soft-bodied robot from the magnetization process, so that the entire manufacturing process is very simple. Moreover, the internal magnetization distribution is reconfigurable, which provides a completely new technical approach for realizing multifunctional magnetic soft-bodied robots.

In some embodiments, the pulse power supply module comprises a discharge capacitor, a discharge switch, and a freewheeling circuit. The discharge capacitor is used to store electric energy. The discharge switch is used to trigger the conduction of the discharge circuit, so that the pulse current provided by the discharge capacitor can flow into the magnetizing coil module. The freewheeling circuit comprises a freewheeling diode and a freewheeling resistor, and is used to adjust a current waveform. When the freewheeling resistor has relatively small resistance (which may be as low as 0), a discharge current is a non-oscillating waveform, and after it flows into the coil, a non-oscillating magnetic field can be generated and used to magnetize the magnetic soft-bodied robot. When the freewheeling resistor has relatively large resistance (of which an optimal value is infinity) or when the freewheeling circuit is disconnected, the discharge current is an oscillating waveform, and after it flows into the coil, an oscillating magnetic field can be generated and used to demagnetize the magnetic soft-bodied robot.

In some embodiments, the upper magnetizing coil unit and the lower magnetizing coil unit each further comprise a magnetic concentrator. The magnetic concentrator is made of a good conductor material. In some embodiments of the present invention, the magnetic concentrator comprises two hollow coaxially arranged up and down with different end surface areas, wherein the end surface area of a first cylinder structure is smaller than the end surface area of a second cylinder structure. The magnetic concentrator further comprises a magnetic concentrator gap arranged along a radial direction. The shape of the end surfaces of the first cylinder structure and the end surfaces of the second cylinder structure is not limited, such as a circular shape, a regular or irregular polygon, or the like. In a preferred embodiment, one end of the magnetic concentrator gap arranged along the radial direction is located at an inner wall of the first cylinder structure and the second cylinder structure, and the other end is located at an outer side edge of the second cylinder structure. Generally speaking, the smaller the width of the magnetic concentrator gap, the better the magnetic concentration effect. In a preferred embodiment of the present invention, the width of the magnetic concentrator may be set to be no more than $1/40$ of a difference between a circumference of an end surface of a first cylinder and a circumference of an end surface of a second cylinder. The setting of the magnetic concentrator can concentrate the magnetic field on its small-sized end face region, which is the target magnetization region of the magnetic soft-bodied robot. In a case in which the coils are not changed, the magnetization characteristics of soft-bodied robots with different scales can be adjusted and controlled by means of adjusting the end face size of the magnetic concentrator, which makes it possible to adjust and control the magnetization characteristics of miniature soft-bodied robots.

In some embodiments, the lower magnetizing coil unit is coaxially arranged with a first supporting plate, a lower coil arranged with a reinforcement layer on the periphery, an insulating plate, a lower magnetic concentrator, and a second supporting plate, in order from bottom to top. The upper magnetizing coil unit and the lower magnetizing coil unit are axisymmetrically arranged up and down. Therefore, the upper magnetizing coil unit is coaxially arranged with a first supporting plate, an upper coil arranged with a reinforcement layer on the periphery, an insulating plate, an upper magnetic concentrator, and a second supporting plate, in order from top to bottom. The second supporting plate is provided with a central hole for the first cylinder structure of the magnetic concentrator with a small end face size to be embedded therein.

In some embodiments, sub-components in the upper magnetizing coil unit and the lower magnetizing coil unit are connected and fixed as a whole by means of nuts and screws, respectively.

In some embodiments, the magnetic soft-bodied robot is composed of permanent magnetic materials (such as NdFeB magnetic particles) and soft materials (such as silica gel, TPE material, hydrogel or the like) at a micron level or less.

A tooling system composed of the first supporting plates, the second supporting plates, the insulating plates and so on in the upper and lower magnetizing coil units is mainly composed of supporting members and bolts made of non-magnetically permeable conductive materials (such as epoxy plates). On the one hand, it is used to connect the coils and the magnetic concentrator as a whole. On the other hand, it is used to ensure the stability of the upper and lower driving coils after being stressed in the discharge process. For example, the first supporting plate and the second supporting plate are both epoxy supporting plates.

The present invention further provides a method for adjusting and controlling internal magnetization characteristics of a magnetic soft-bodied robot on the basis of the system described above, comprising the following steps:

(1) placing the magnetic soft-bodied robot between the upper magnetizing coil unit and the lower magnetizing coil unit, and moving the target magnetization region of the magnetic soft-bodied robot to the magnetic field action region;

(2) determining a magnitude of resistance of the freewheeling circuit (0 or infinity) in the pulse power supply module according to the magnetization requirements (magnetization or demagnetization) of the target magnetization region of the magnetic soft-bodied robot;

(3) selecting connection modes (forward connection or reverse connection) of the coils in the upper magnetizing coil unit and the lower magnetizing coil unit according to local magnetization direction requirements of the target magnetization region of the magnetic soft-bodied robot; and (4) charging the discharge capacitor in the pulse power supply module, and then triggering the discharge switch to discharge the upper magnetizing coil unit and the lower magnetizing coil unit, and to generate a magnetic field in the target magnetization region of the magnetic soft-bodied robot so as to produce a magnetization effect.

In some embodiments, the method further comprises steps of:

(5) repeating steps (1) to (4) to complete the magnetization adjustment and control of other target magnetization regions of the magnetic soft-bodied robot; and (6) after the magnetization is completed, taking out a sample of the magnetic soft-bodied robot.

In some embodiments, as shown in FIG. 1, the system for adjusting and controlling the internal magnetization characteristics of the magnetic soft-bodied robot is composed of an upper magnetizing coil unit 7, a lower magnetizing coil unit (comprising an epoxy supporting plate, i.e. a first supporting plate 16, a copper conductor, i.e. a lower coil 14, a reinforcement layer 13, an insulating plate 12, a lower magnetic concentrator 11 and an epoxy supporting plate, i.e. a second supporting plate 10, in order from bottom to top), a screw 17, a nut 6, a coil nose 15 and other components. The internal structure of the upper magnetizing coil unit 7 is the same as that of the lower magnetizing coil unit, and the entire coil system is fixed as a whole by means of the nut 6 and the screw 17. In order to ensure that the sample, i.e. the magnetic soft-bodied robot 9, can be effectively placed in the magnetic field action region, a positioning plate 8 may be designed for positioning.

The magnetic concentrator 11 comprises two hollow cylinders coaxially arranged up and down with different end surface areas, wherein the sectional area of the upper cylinder is much smaller than the sectional area of the lower cylinder. The gap of the magnetic concentrator passes through a half longitudinal-section of the upper cylinder, a half longitudinal-section of the lower cylinder structure and a common axis of the two cylinder structures at the same time. Schematic diagrams of the magnetic concentrator 11 under front and back viewing angles are as shown by 11a and 11b. Its working principle is to block a current flow 11f in a larger section by means of the gap 11c, so as to lead the current to a smaller section 11e, realizing focusing of the current and magnetic field.

Figure 2:
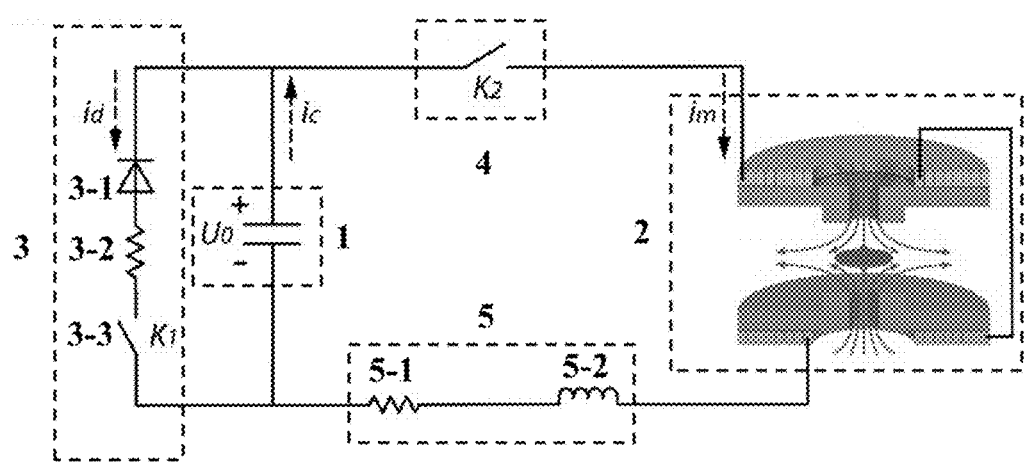
FIG. 2 is a schematic diagram of a circuit structure of a magnetization system for a magnetic soft-bodied robot provided by the present invention.
Figure 3:
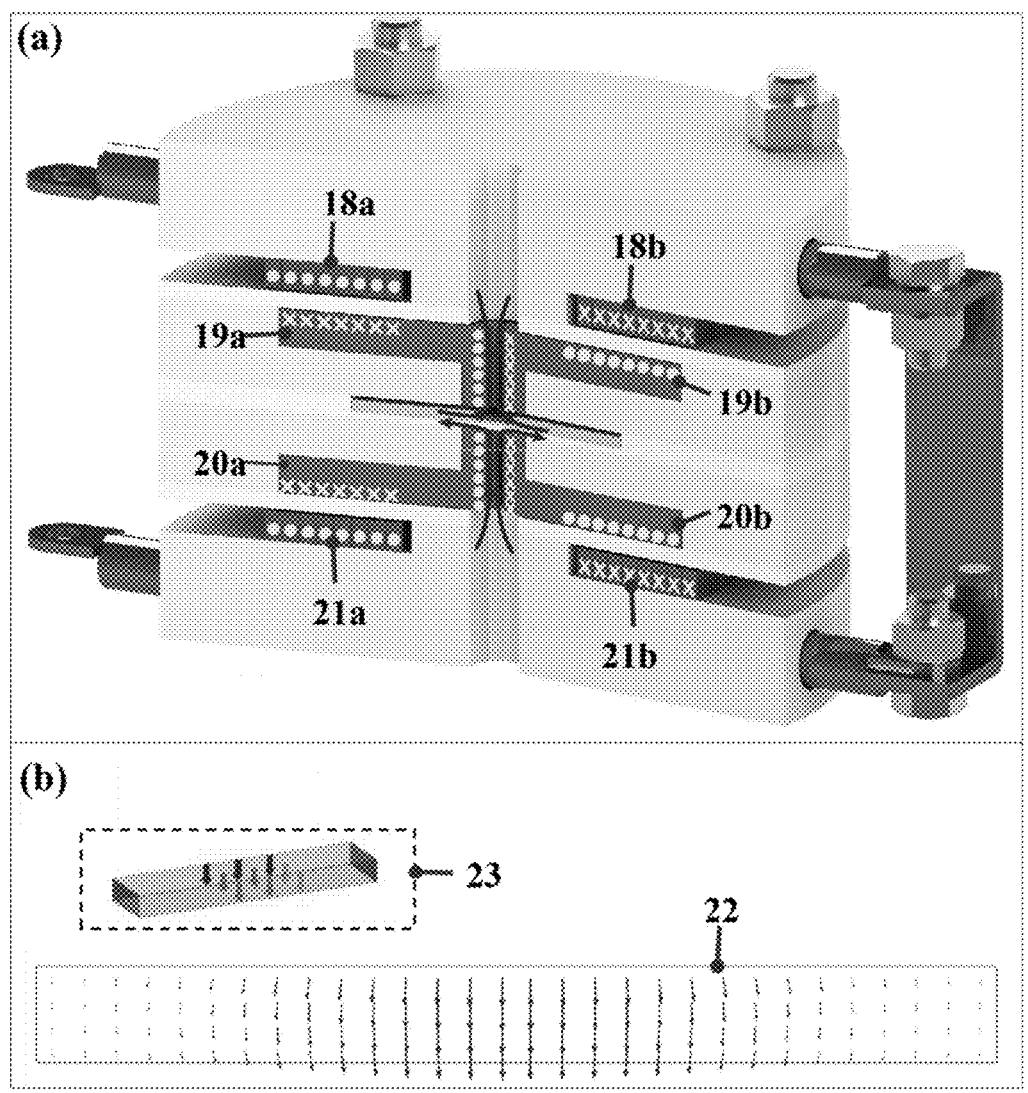
FIG. 3 consists of schematic diagrams of current and magnetization effects in an axial magnetization pattern provided by the present invention.

In some embodiments, a circuit system as shown in FIG. 2 is used to realize the magnetization of the magnetic sample. Specifically, it comprises a discharge capacitor 1, the system 2 for adjusting and controlling the internal magnetization characteristics of the magnetic soft-bodied robot according to the present invention, a discharge switch 4, a line impedor 5 (a line resistor 5-1 and an inductor 5-2), and a freewheeling circuit 3 (a diode 3-1, a freewheeling resistor 3-2 and a freewheeling switch 3-3). Before discharging, the freewheeling circuit switch 3-3 is turned on to charge the capacitor 1, and then the discharge switch 4 is turned on to discharge the magnetizing coil module 2. As shown in contents (a) and (b) of FIG. 3, for an axial magnetization pattern, a current flow direction (18a and 18b) of the upper copper coil is the same as a current flow direction (21a and 21b) of the lower copper coil. Accordingly, an eddy current flow direction (19a and 19b) induced in the upper magnetic concentrator is the same as an eddy current flow direction (20a and 20b) induced in the lower magnetic concentrator. On the basis of the above-mentioned current flow characteristics, the magnetic field in the sample region is dominated by an axial magnetic field in a central region 22, so that the particles in the sample can form an axial magnetization distribution characteristic as shown in 23.

Figure 4:
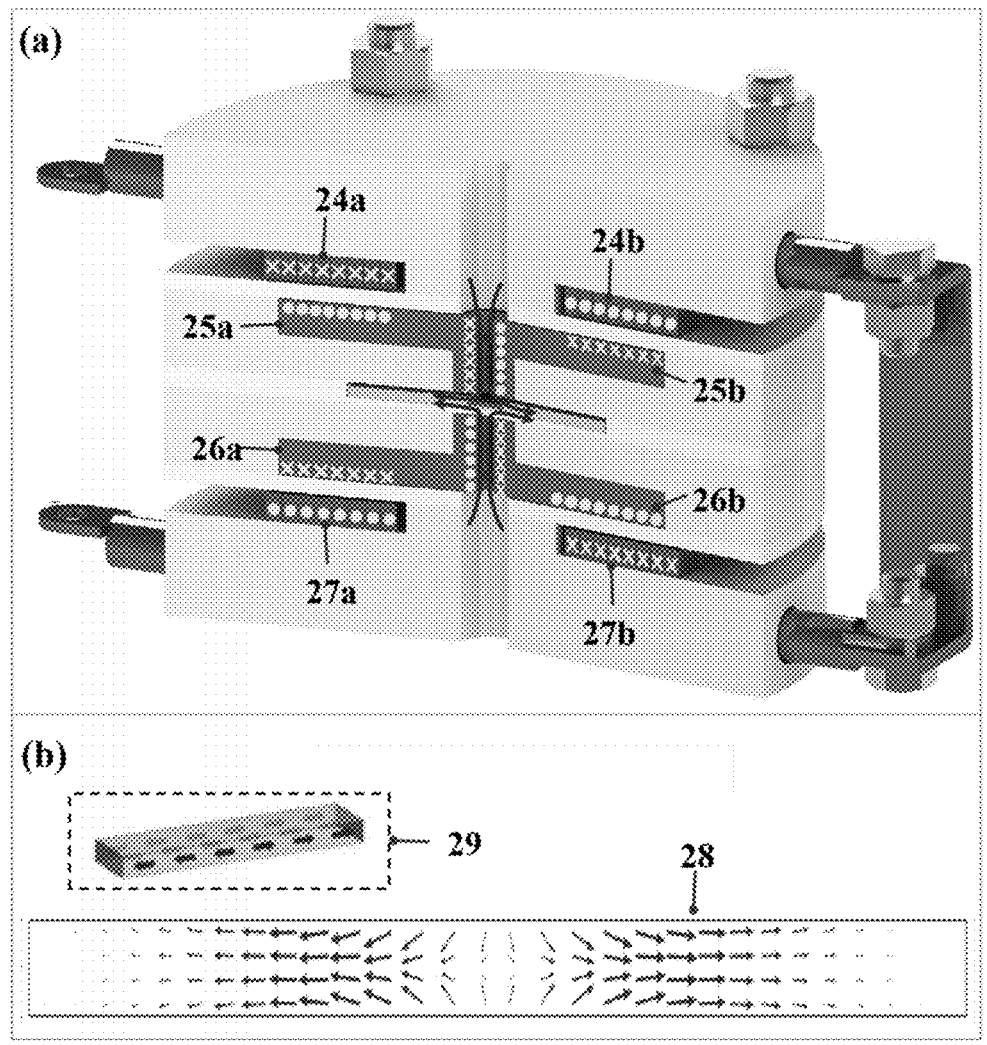
FIG. 4 consists of schematic diagrams of current and magnetization effects in a radial magnetization pattern provided by the present invention.

In some embodiments, a circuit system as shown in FIG. 2 is used to realize the magnetization of the magnetic sample. Specifically, it comprises a discharge capacitor 1, the system 2 for adjusting and controlling the internal magnetization characteristics of the magnetic soft-bodied robot according to the present invention, a discharge switch 4, a line impedor 5 (a line resistor 5-1 and an inductor 5-2), and a freewheeling circuit 3 (a diode 3-1, a freewheeling resistor 3-2 and a freewheeling switch 3-3). Before discharging, the freewheeling circuit switch 3-3 is turned on to charge the capacitor 1, and then the discharge switch 4 is turned on to discharge the magnetizing coil module 2. As shown in content (a) and (b) of FIG. 4, for a radial magnetization pattern, a current flow direction (24a and 24b) of the upper copper coil is opposite to a current flow direction (26a and 26b) of the lower copper coil. Accordingly, an eddy current flow direction (25a and 25b) induced in the upper magnetic concentrator is opposite to an eddy current flow direction (26a and 26b) induced in the lower magnetic concentrator. On the basis of the above-mentioned current flow characteristics, the magnetic field in the sample region is dominated by a radial component 28, so that the particles in the sample can form a radial magnetization distribution characteristic as shown in 29.

Figure 5:
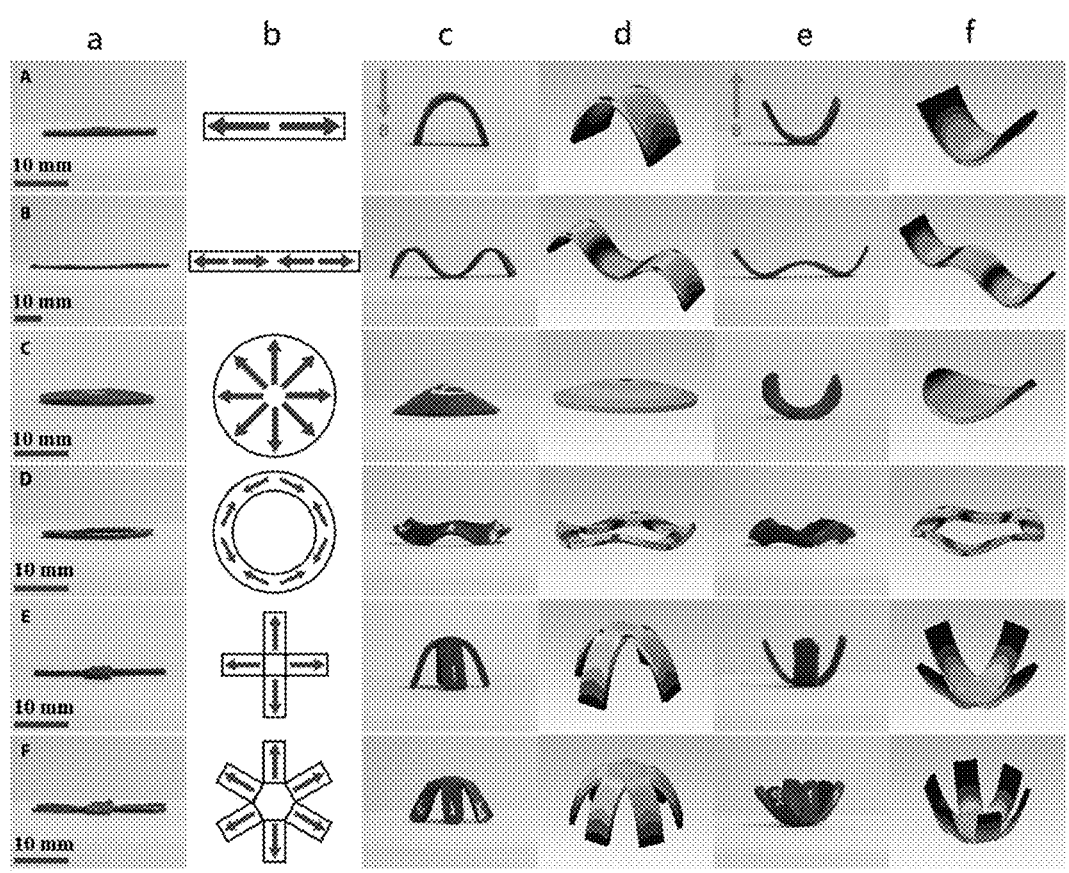
FIG. 5 consists of magnetization design, simulation and experimental diagrams for realizing two-dimensional and three-dimensional deformations of a magnetic soft-bodied robot according to the present invention.

In other embodiments, multiple types of radially magnetized magnetic soft-bodied robots are realized as follows: FIG. 5 shows deformation characteristics of multiple types of magnetic soft-bodied robots realized on the basis of the radial magnetization technology provided by the present invention under the action of magnetic fields, where rows A to F represent six types of magnetic soft-bodied robots, respectively, and columns a to f represent schematic diagrams of initial morphology and magnetization, experimental diagrams of deformation under the action of a vertical downward magnetic field, simulation diagrams of deformation under the action of a vertical downward magnetic field, experimental diagrams of deformation under the action of a vertical upward magnetic field, and simulation diagrams of deformation under the action of a vertical upward magnetic field of the magnetic soft-bodied robots, respectively. The details are as follows: 1) FIGS. 5Aa-5Af (wherein FIG. 5Aa represents row A and column a in FIG. 5, and the following has the same meaning) show morphological transformations of a strip-shaped soft magnetic robot with a single-group symmetrical radial magnetization characteristic from one-dimensional strip to two-dimensional "n" and "v" shapes. This type of robot can be realized by a single discharge on the basis of the provided magnetization device. 2) FIGS. 5Ba-5Bf show morphological transformations of a strip-shaped soft magnetic robot with a double-group symmetrical radial magnetization characteristic from one-dimensional strip to two-dimensional "m" and "w" shapes. This type of magnetic soft-bodied robot can be realized by a two-step magnetization method (discharging left and right sides of the robot in sequence) on the basis of the provided magnetization device. 3) FIGS. 5Ca-5Cf show morphological transformation characteristics of a circular soft magnetic robot with a symmetrical radial magnetization characteristic under the action of magnetic fields. This type of robot can be realized by a single discharge on the basis of the provided magnetization device. 4) FIGS. 5Da-5Df show morphological transformation characteristics of a circular magnetic soft-bodied robot with a four-group symmetric radial magnetization characteristic under the action of magnetic fields. This type of magnetic soft-bodied robot can be realized by a four-step magnetization method (discharging at positions of 0°, 90°, 180°, and 270° along a circle in sequence) on the basis of the provided magnetization device. 5) FIGS. 5Ea-5Ef show morphological transformation characteristics of a four-jaw magnetic soft-bodied robot with a single-group symmetric radial magnetization characteristic under the action of magnetic fields. This type of robot can be realized by a single discharge on the basis of the provided magnetization device. 6) FIGS. 5Fa-5Ff show morphological transformation characteristics of a six-jaw magnetic soft-bodied robot with a single-group symmetric radial magnetization characteristic under the action of magnetic fields. This type of robot can be realized by a single discharge on the basis of the provided magnetization device. The above results fully prove that the magnetization technology provided by the present invention can realize abundant magnetization distribution characteristics inside the magnetic samples, so that it can be used to realize the functions of multiple types of different magnetic soft-bodied robots.

Figure 6:
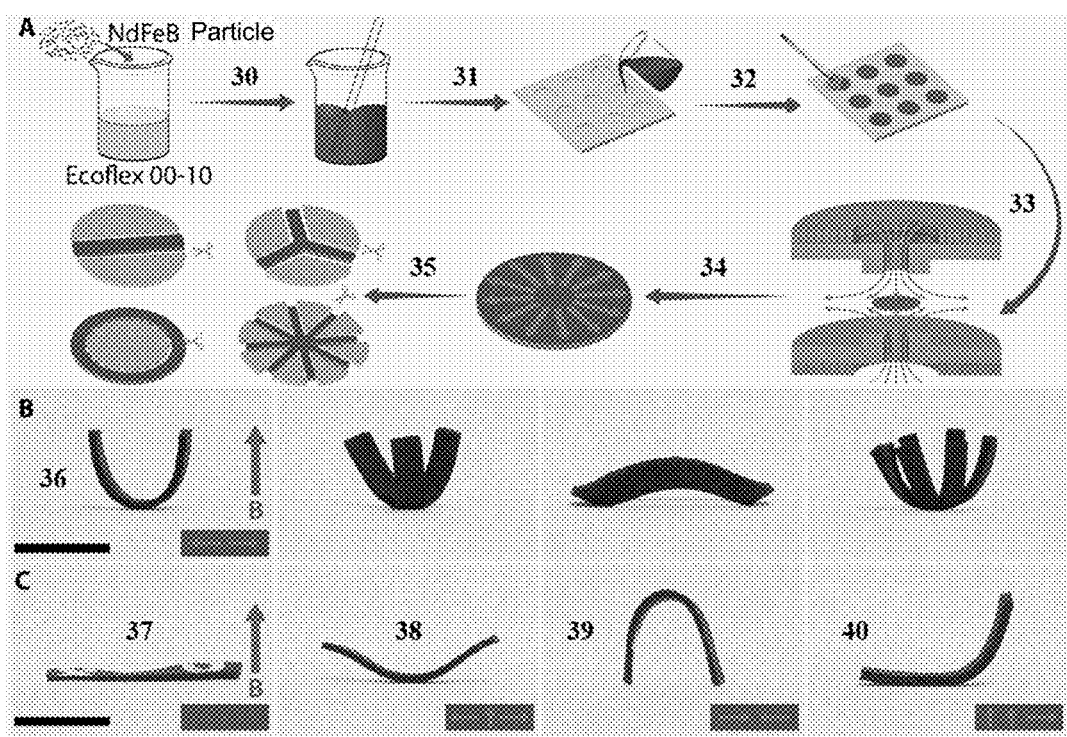
FIG. 6 consists of schematic diagrams and experimental diagrams of the implementation of the present invention to realize multiple types of magnetic soft-bodied robots on the basis of the same magnetized sample.

In other embodiments, the realization of multiple types of magnetic soft-bodied robots based on the same magnetized sample is as follows: FIG. 6 shows how to realize multiple types of magnetic soft-bodied robots under the same magnetized sample on the basis of the magnetization method provided by the present invention. Content A of FIG. 6 shows a preparation and magnetization process of multiple types of magnetic soft-bodied robots. Specifically, a disk-shaped sample composed of a magnetic composite soft material is first prepared (comprising mixing and stirring 30 of NdFeB particles and Ecoflex00-10, pouring 31 of a mixed liquid, solidification 32 of a sample, and sampling 33). After that, a disk-shaped sample with a radial magnetization characteristic is prefabricated 34 by means of a simple one-step magnetization method, and then it may be cut into specific structures (35). Content B of FIG. 6 shows morphological characteristics of deformation of a strip robot, a three-jaw robot, a circular robot and a six-jaw robot formed by cutting under the action of a vertical upward magnetic field. The content C of FIG. 6 shows that the magnetization characteristics of a strip robot 36 can be reconfigured on the basis of the magnetization method provided by the present invention, including optionally removing magnetism 37 (the operation is as follows: before discharging, the freewheeling circuit switch 3-3 in FIG. 1 is turned off to charge the capacitor 1, and then the discharge switch 4 is turned on to discharge the magnetizing coil module 2 to form an oscillating magnetic field, realizing the demagnetization function), adding an axial magnetization component 38 (the central region of the robot 36 is magnetized on the basis of the axial magnetization pattern shown in FIG. 3, wherein the direction of the magnetization magnetic field is upward), changing a radial magnetization component direction 39 (the robot 36 is magnetized on the basis of the radial magnetization pattern shown in FIG. 4, wherein the direction of the magnetization magnetic field is opposite to the original magnetization direction), and adjusting a local magnetization component direction 40 (the left region of the robot 36 is magnetized on the basis of the axial magnetization pattern shown in FIG. 3, wherein the direction of the magnetization magnetic field is upward). The above results fully prove that the magnetization technology provided by the present invention is simple to operate, has strong functionality, and can reconfigure the internal magnetization characteristics of magnetic soft-bodied robots.

It would be easily understood by a person skilled in the art that only preferred embodiments of the present invention are described above, but they are not used to limit the present invention, and any modifications, equivalent substitutions and improvements made within the spirit or principle of the present invention should be covered within the scope of protection of the present invention.

The invention claimed is:

1. A system for adjusting and controlling internal magnetization characteristics of a magnetic soft-bodied robot, comprising:

a pulse power supply module, a magnetizing coil module and the magnetic soft-bodied robot;

the pulse power supply module is used to provide a pulse current for the magnetizing coil module; and the magnetizing coil module is used to generate an oscillating or non-oscillating magnetic field under the pulse current provided by the pulse power supply module, and to perform non-oscillating magnetization or oscillating demagnetization of the magnetic soft-bodied robot, wherein:

the magnetizing coil module comprises an upper magnetizing coil unit and a lower magnetizing coil unit, the upper magnetizing coil unit and the lower magnetizing coil unit are axisymmetrically arranged up and down, the upper magnetizing coil unit and the lower magnetizing coil unit each comprise a coil, the magnetic soft-bodied robot is located between the upper magnetizing coil unit and the lower magnetizing coil unit, a target magnetization region of the magnetic soft-bodied robot is located in a magnetic field action region of the upper magnetizing coil unit and the lower magnetizing coil unit, and the upper magnetizing coil unit and the lower magnetizing coil unit axisymmetrically arranged up and down are used to focus magnetic fields generated by their coils to the target magnetization region of the magnetic soft-bodied robot; and when in use, wiring modes of the coils in the upper magnetizing coil unit and the lower magnetizing coil unit are set according to magnetization requirements of the target magnetization region of the magnetic soft-bodied robot to control current directions in the coils in the upper magnetizing coil unit and the lower magnetizing coil unit, and then perform magnetization adjustment and control on the target magnetization region of the magnetic soft-bodied robot.

2. The system according to claim 1, wherein the wiring modes of the coils in the upper magnetizing coil unit and the lower magnetizing coil unit are set according to the magnetization requirements of the target magnetization region of the magnetic soft-bodied robot to control the current directions in the coils in the upper magnetizing coil unit and the lower magnetizing coil unit, and then to control a radial or axial magnetic field to be generated in the target magnetization region of the magnetic soft-bodied robot, which is specifically as follows:

when the current direction of the coil in the upper magnetizing coil unit is controlled to be the same as the current direction of the coil in the lower magnetizing coil unit, the axial magnetic field is generated in the target magnetization region of the magnetic soft-bodied robot, and magnetic particles in the target magnetization region form an axial magnetization distribution characteristic; and when the current direction of the coil in the upper magnetizing coil unit is controlled to be opposite to the current direction of the coil in the lower magnetizing coil unit, the radial magnetic field is generated in the target magnetization region of the magnetic soft-bodied robot, and the magnetic particles in the target magnetization region form a radial magnetization distribution characteristic.

3. A method for adjusting and controlling internal magnetization characteristics of a magnetic soft-bodied robot on the basis of the system according to claim 2, comprising:

(1) placing the magnetic soft-bodied robot between the upper magnetizing coil unit and the lower magnetizing coil unit, and moving the target magnetization region of the magnetic soft-bodied robot to the magnetic field action region;

(2) determining a magnitude of resistance of the freewheeling circuit in the pulse power supply module according to the magnetization requirements of the target magnetization region of the magnetic soft-bodied robot;

(3) selecting connection modes of the coils in the upper magnetizing coil unit and the lower magnetizing coil unit according to magnetization direction requirements of the target magnetization region of the magnetic soft-bodied robot; and (4) charging the discharge capacitor in the pulse power supply module, and then triggering the discharge switch to discharge the upper magnetizing coil unit and the lower magnetizing coil unit, and to generate a magnetic field in the target magnetization region of the magnetic soft-bodied robot so as to produce a magnetization effect.

4. The system according to claim 1, wherein the pulse power supply module comprises a discharge capacitor, a discharge switch and a freewheeling circuit;

the discharge capacitor is used to store electric energy;

the discharge switch is used to trigger conduction of the discharge circuit, so that a pulse current provided by the discharge capacitor can flow into the magnetizing coil module; and the freewheeling circuit comprises a freewheeling diode and a freewheeling resistor, and is used to adjust a current waveform.

5. A method for adjusting and controlling internal magnetization characteristics of a magnetic soft-bodied robot on the basis of the system according to claim 4, comprising:

(1) placing the magnetic soft-bodied robot between the upper magnetizing coil unit and the lower magnetizing coil unit, and moving the target magnetization region of the magnetic soft-bodied robot to the magnetic field action region;

(2) determining a magnitude of resistance of the freewheeling circuit in the pulse power supply module according to the magnetization requirements of the target magnetization region of the magnetic soft-bodied robot;

(3) selecting connection modes of the coils in the upper magnetizing coil unit and the lower magnetizing coil unit according to magnetization direction requirements of the target magnetization region of the magnetic soft-bodied robot; and (4) charging the discharge capacitor in the pulse power supply module, and then triggering the discharge switch to discharge the upper magnetizing coil unit and the lower magnetizing coil unit, and to generate a magnetic field in the target magnetization region of the magnetic soft-bodied robot so as to produce a magnetization effect.

6. The system according to claim 1, wherein the coil is formed by wire winding or conductor cutting, a reinforcing material is arranged on the periphery of the coil, and the coil is used as a discharge circuit load to generate a magnetic field.

7. A method for adjusting and controlling internal magnetization characteristics of a magnetic soft-bodied robot on the basis of the system according to claim 6, comprising:

(1) placing the magnetic soft-bodied robot between the upper magnetizing coil unit and the lower magnetizing coil unit, and moving the target magnetization region of the magnetic soft-bodied robot to the magnetic field action region;

(2) determining a magnitude of resistance of the freewheeling circuit in the pulse power supply module according to the magnetization requirements of the target magnetization region of the magnetic soft-bodied robot;

(3) selecting connection modes of the coils in the upper magnetizing coil unit and the lower magnetizing coil unit according to magnetization direction requirements of the target magnetization region of the magnetic soft-bodied robot; and (4) charging the discharge capacitor in the pulse power supply module, and then triggering the discharge switch to discharge the upper magnetizing coil unit and the lower magnetizing coil unit, and to generate a magnetic field in the target magnetization region of the magnetic soft-bodied robot so as to produce a magnetization effect.

8. The system according to claim 1, wherein the upper magnetizing coil unit and the lower magnetizing coil unit each further comprise a magnetic concentrator, the magnetic concentrator is made of a good conductor material, the magnetic concentrator comprises two hollow cylinder structures coaxially arranged up and down with different end surface areas, wherein the end surface area of a first cylinder structure is smaller than the end surface area of a second cylinder structure; and the magnetic concentrator further comprises a magnetic concentrator gap arranged along a radial direction.

9. A method for adjusting and controlling internal magnetization characteristics of a magnetic soft-bodied robot on the basis of the system according to claim 8, comprising:
(1) placing the magnetic soft-bodied robot between the upper magnetizing coil unit and the lower magnetizing coil unit, and moving the target magnetization region of the magnetic soft-bodied robot to the magnetic field action region;
(2) determining a magnitude of resistance of the freewheeling circuit in the pulse power supply module according to the magnetization requirements of the target magnetization region of the magnetic soft-bodied robot;
(3) selecting connection modes of the coils in the upper magnetizing coil unit and the lower magnetizing coil unit according to magnetization direction requirements of the target magnetization region of the magnetic soft-bodied robot; and
(4) charging the discharge capacitor in the pulse power supply module, and then triggering the discharge switch to discharge the upper magnetizing coil unit and the lower magnetizing coil unit, and to generate a magnetic field in the target magnetization region of the magnetic soft-bodied robot so as to produce a magnetization effect.

10. The system according to claim 8, wherein the lower magnetizing coil unit is coaxially arranged with a first supporting plate, a lower coil arranged with a reinforcement layer on the periphery, an insulating plate, a lower magnetic concentrator and a second supporting plate, in order from bottom to top;
the upper magnetizing coil unit is coaxially arranged with a first supporting plate, an upper coil arranged with a reinforcement layer on the periphery, an insulating plate, an upper magnetic concentrator, and a second supporting plate, in order from top to bottom;
a positioning plate for positioning the magnetic soft-bodied robot is arranged between the upper magnetizing coil unit and the lower magnetizing coil unit;
the upper magnetic concentrator and the lower magnetic concentrator have the same structure, and are axisymmetrically arranged up and down; the magnetic soft-bodied robot is arranged between an end surface of the first cylinder structure of the upper magnetic concentrator and an end surface of the first cylinder structure of the lower magnetic concentrator, and the upper magnetic concentrator and the lower magnetic concentrator axisymmetrically arranged up and down are used to further focus magnetic fields generated by an upper coil and a lower coil to the target magnetization region of the magnetic soft-bodied robot;
the upper coil and the lower coil are arranged in series to ensure consistency of a time sequence; and
when in use, wiring modes of the upper coil and the lower coil are set according to the magnetization requirements of the target magnetization region of the magnetic soft-bodied robot to control current directions in the upper coil and the lower coil and eddy current directions induced in the upper magnetic concentrator and the lower magnetic concentrator, and then to control a radial or axial magnetic field to be generated in the target magnetization region of the magnetic soft-bodied robot.

11. A method for adjusting and controlling internal magnetization characteristics of a magnetic soft-bodied robot on the basis of the system according to claim 10, comprising:
(1) placing the magnetic soft-bodied robot between the upper magnetizing coil unit and the lower magnetizing coil unit, and moving the target magnetization region of the magnetic soft-bodied robot to the magnetic field action region;
(2) determining a magnitude of resistance of the freewheeling circuit in the pulse power supply module according to the magnetization requirements of the target magnetization region of the magnetic soft-bodied robot;
(3) selecting connection modes of the coils in the upper magnetizing coil unit and the lower magnetizing coil unit according to magnetization direction requirements of the target magnetization region of the magnetic soft-bodied robot; and
(4) charging the discharge capacitor in the pulse power supply module, and then triggering the discharge switch to discharge the upper magnetizing coil unit and the lower magnetizing coil unit, and to generate a magnetic field in the target magnetization region of the magnetic soft-bodied robot so as to produce a magnetization effect.

12. The system according to claim 10, wherein the wiring modes of the coils in the upper magnetizing coil unit and the lower magnetizing coil unit are set according to the magnetization requirements of the target magnetization region of the magnetic soft-bodied robot to control the current directions in the coils in the upper magnetizing coil unit and the lower magnetizing coil unit, and then to control a radial or axial magnetic field to be generated in the target magnetization region of the magnetic soft-bodied robot, which is specifically as follows:
when the current direction of the coil in the upper magnetizing coil unit is controlled to be the same as the current direction of the coil in the lower magnetizing coil unit, the eddy current direction induced in the upper magnetic concentrator is the same as the eddy current direction induced in the lower magnetic concentrator, and then the axial magnetic field is generated in the target magnetization region of the magnetic soft-bodied robot, and magnetic particles in the target magnetization region form an axial magnetization distribution characteristic; and when the current direction of the coil in the upper magnetizing coil unit is controlled to be opposite to the current direction of the coil in the lower magnetizing coil unit, the eddy current direction induced in the upper magnetic concentrator is opposite to the eddy current direction induced in the lower magnetic concentrator, and then the radial magnetic field is generated in the target magnetization region of the magnetic soft-bodied robot, and the magnetic particles in the target magnetization region form a radial magnetization distribution characteristic.

13. A method for adjusting and controlling internal magnetization characteristics of a magnetic soft-bodied robot on the basis of the system according to claim 12, comprising:
(1) placing the magnetic soft-bodied robot between the upper magnetizing coil unit and the lower magnetizing coil unit, and moving the target magnetization region of the magnetic soft-bodied robot to the magnetic field action region;
(2) determining a magnitude of resistance of the freewheeling circuit in the pulse power supply module according to the magnetization requirements of the target magnetization region of the magnetic soft-bodied robot;
- (3) selecting connection modes of the coils in the upper magnetizing coil unit and the lower magnetizing coil unit according to magnetization direction requirements of the target magnetization region of the magnetic soft-bodied robot; and
- (4) charging the discharge capacitor in the pulse power supply module, and then triggering the discharge switch to discharge the upper magnetizing coil unit and the lower magnetizing coil unit, and to generate a magnetic field in the target magnetization region of the magnetic soft-bodied robot so as to produce a magnetization effect.

14. A method for adjusting and controlling internal magnetization characteristics of a magnetic soft-bodied robot on the basis of the system according to claim 1, comprising:
- (1) placing the magnetic soft-bodied robot between the upper magnetizing coil unit and the lower magnetizing coil unit, and moving the target magnetization region of the magnetic soft-bodied robot to the magnetic field action region;
- (2) determining a magnitude of resistance of the freewheeling circuit in the pulse power supply module according to the magnetization requirements of the target magnetization region of the magnetic soft-bodied robot;
- (3) selecting connection modes of the coils in the upper magnetizing coil unit and the lower magnetizing coil unit according to magnetization direction requirements of the target magnetization region of the magnetic soft-bodied robot; and
- (4) charging the discharge capacitor in the pulse power supply module, and then triggering the discharge switch to discharge the upper magnetizing coil unit and the lower magnetizing coil unit, and to generate a magnetic field in the target magnetization region of the magnetic soft-bodied robot so as to produce a magnetization effect.

15. The method according to claim 14, wherein the magnetization requirements in step (2) include magnetization or demagnetization; and in that the magnitude of resistance of the freewheeling circuit in the pulse power supply module is 0 or infinity.

16. The method according to claim 14, wherein the connection modes in step (3) include a forward connection or a reverse connection.

* * * * *